United States Patent
Murai et al.

(10) Patent No.: US 10,327,368 B2
(45) Date of Patent: Jun. 18, 2019

(54) PANEL DEVICE INCLUDING A PANEL AND A SUPPORT MECHANISM

(71) Applicant: FUJI CORPORATION, Chiryu (JP)

(72) Inventors: Masaki Murai, Nishio (JP); Toshihiko Yamasaki, Nisshin (JP); Toshinori Shimizu, Kariya (JP)

(73) Assignee: FUJI CORPORATION, Chiryu (JP)

( * ) Notice: Subject to any disclaimer, the term of this patent is extended or adjusted under 35 U.S.C. 154(b) by 273 days.

(21) Appl. No.: 15/126,545

(22) PCT Filed: Mar. 17, 2014

(86) PCT No.: PCT/JP2014/057099
§ 371 (c)(1),
(2) Date: Sep. 15, 2016

(87) PCT Pub. No.: WO2015/140896
PCT Pub. Date: Sep. 24, 2015

(65) Prior Publication Data
US 2017/0086340 A1    Mar. 23, 2017

(51) Int. Cl.
*H05K 13/00* (2006.01)
*H05K 13/04* (2006.01)
(Continued)

(52) U.S. Cl.
CPC .......... *H05K 13/046* (2013.01); *F16M 11/02* (2013.01); *F16M 11/08* (2013.01); *F16M 13/00* (2013.01);
(Continued)

(58) Field of Classification Search
CPC ........ F16M 2200/021; H01L 21/67144; H04N 5/64; H05K 13/0069; H05K 13/046; H05K 13/0888
See application file for complete search history.

(56) References Cited

U.S. PATENT DOCUMENTS 5,400,497 A * 3/1995 Watanabe .......... H05K 13/0404
29/705
8,020,285 B2 * 9/2011 Nies ....................... H05K 13/08
29/739

(Continued)

FOREIGN PATENT DOCUMENTS

JP    2007-35744 A    2/2007
JP    2009-170442 A   7/2009

OTHER PUBLICATIONS

International Search Report dated Jun. 24, 2014 in PCT/JP14/057099 Filed Mar. 17, 2014.

(Continued)

*Primary Examiner* — Minh N Trinh
(74) *Attorney, Agent, or Firm* — Oblon, McClelland, Maier & Neustadt, L.L.P.

(57) ABSTRACT

A panel device including a panel for performing at least one of input and output of information related to operation of a work machine, a panel-side support axis fixed to the panel, a connecting arm that is swingably held by the two support axes, a guide rail formed on the work machine side, a bolt that moves along the guide rail, and a regulating arm attached to the bolt and held so as to be oscillatable by the panel-side support axis. When the connecting arm is oscillated, the oscillation of the connecting arm and the angle of the panel is regulated by the regulating arm.

6 Claims, 16 Drawing Sheets

(51) Int. Cl.

| | | |
|---|---|---|
| *H05K 13/08* | (2006.01) | |
| *F16M 11/02* | (2006.01) | |
| *F16M 13/00* | (2006.01) | |
| *F16M 11/08* | (2006.01) | |
| *F16M 13/02* | (2006.01) | |
| *H01L 21/67* | (2006.01) | |
| *H04N 5/64* | (2006.01) | |

(52) U.S. Cl.
CPC ..... *F16M 13/022* (2013.01); *H01L 21/67144* (2013.01); *H05K 13/0069* (2013.01); *H05K 13/0888* (2018.08); *F16M 2200/021* (2013.01); *H04N 5/64* (2013.01)

(56) References Cited

U.S. PATENT DOCUMENTS

| | | | |
|---|---|---|---|
| 8,844,124 B2* | 9/2014 | Itose | H05K 9/00 29/742 |
| 9,961,817 B2* | 5/2018 | Shimizu | H05K 13/021 |
| 2017/0086340 A1* | 3/2017 | Murai | F16M 11/02 |
| 2018/0303016 A1* | 10/2018 | Iwata | H05K 13/04 |

OTHER PUBLICATIONS

Chinese Office Action dated Aug. 3, 2018 in Patent Application No. 201480077141.1 (submitting English translation only), 4 pages.

\* cited by examiner

PANEL DEVICE INCLUDING A PANEL AND A SUPPORT MECHANISM

TECHNICAL FIELD

The present application relates to a panel device for performing at least one of input and output of information related to operation of a work machine, and a work machine provided with the panel device.

BACKGROUND ART

Many work machines are provided with a panel device for performing at least one of input and output of information related to operation of the work machine. Among such panel devices are items with panels that are supported rotatably and items for which the position of the panel is changeable. With the panel devices disclosed in the patent literature below, the panel is rotatable around a support axis, or the panel is movable around a support axis.

Patent Literature 1: JP-A-2009-170442
Patent Literature 2: JP-A-2007-035744

Summary

In recent years, work machines have become more compact, so securing arrangement space for a panel device is problematic. Thus, there are cases in which panel devices are provided in front of work machine covers, or in front of other devices or the like, causing an obstruction to other work. In such a case, with the panel devices disclosed in the above patent literature, it is possible to change the position of the panel device such that it does not obstruct other work, by moving the panel around a support axis. However, as the panel is moved, the direction of the surface of the panel, that is, the display surface or the input surface, changes, making it difficult for an operator to see the display surface or the like of the panel. Specifically, for example, if an operator rotates a panel that is facing the operator 90 degrees around the support axis, the operator is then facing the side surface of the panel, making viewing the display surface of the panel difficult. The present disclosure takes account of such problems and an object thereof is to provide a panel device for which the display surface or the like of the panel is easy to view even when the panel is moved.

Solution to Problem

To solve the above problems, disclosed is a panel device comprising: a panel for performing at least one of input and output of information related to operation of a work machine; and a support mechanism that rotatably supports the panel, wherein the support mechanism includes a first support axis fixed to the work machine, a second support axis fixed to the panel, a connecting arm that is swingably held by the first support axis and the second support axis and connects the first support axis and the second support axis, a guide rail formed on one of the work machine and the panel, an engaging member engaged with the guide rail that moves along the guide rail, and a regulating arm attachable to the engaging member and held on the other of the work machine and the panel so as to be oscillatable by one of the first support axis and the second support axis, further wherein when the panel rotates, the rotation angle of the connecting arm with respect to the first support axis and the rotation angle of the connecting arm with respect to the second support axis are regulated by the regulating arm.

Further, also disclosed is a panel device according to the aspect above, wherein the support mechanism includes a rotation prevention mechanism that prevents at least one of rotation of the connecting arm with respect to the first support axis, and rotation of the connecting arm with respect to the second support axis.

Further, also disclosed is the panel device according to an aspect above, wherein the rotation prevention mechanism, when the engaging member moves to at least one end of the guide rail, prevents at least one of rotation of the connecting arm with respect to the first support axis, and rotation of the connecting arm with respect to the second support axis.

Further, also disclosed is the panel device according to an aspect above, wherein the support mechanism includes an operating member operated when releasing prevention of rotation of the connecting arm by the rotation prevention mechanism, and the operating member is provided on a side section of the panel.

Further, also disclosed is the panel device according to an aspect above, wherein the first support axis, the second support axis, the connecting arm, and the regulating arm are provided on a rear surface of the panel.

Further, also disclosed is the panel device according to an aspect above, wherein the work machine is provided with a work machine cover that covers an upper portion of the work machine and rotates up, and the panel moves in front of the work machine cover when rotated to the work machine side.

Further, also disclosed is a work machine that performs mounting work to a circuit board, the work machine comprising: a mounting work device that functions as at least one of a device for supplying items required for mounting work to the circuit board, a device for ejecting items not required for mounting work, and a device for performing processing required for mounting work; a mounting section, for mounting the mounting work device, that is provided at a predetermined end section of a base; the panel device according to an aspect above provided at the predetermined end section, wherein the mounting work device is configured from a main body mounted on the mounting section, and a slide section that slides with respect to the main body section in a direction away from the panel device.

Advantageous Effects of Invention

Further, the support mechanism that supports the panel includes a first support axis fixed to the work machine, a second support axis fixed to the panel, a connecting arm that is swingably held by the first support axis and the second support axis and connects the first support axis and the second support axis, a guide rail formed on one of the work machine and the panel, an engaging member engaged with the guide rail that moves along the guide rail, and a regulating arm attachable to the engaging member and held on the other of the work machine and the panel so as to be oscillatable by one of the first support axis and the second support axis. Further, when the panel rotates, the rotation angle of the connecting arm with respect to the first support axis and the rotation angle of the connecting arm with respect to the second support axis are regulated by the regulating arm. That is, when the connecting arm oscillates, because the oscillation of the connecting arm and the rotation angle of the panel are regulated by the regulating arm, the display screen or the like of the panel is able to be maintained in a state facing a specified direction. Thus, according to the disclosed panel device, the display surface or the like of the panel is easy to view even when the panel is moved Further, with the panel device having a support mechanism including a rotation prevention device, at least one of rotation of the connecting arm with respect to the first support axis and rotation of the connecting arm with respect to the second support axis is prevented. Thus, the panel is prevented from striking the work machine and so on.

Further, when the engaging member is moved to at least one of the ends of the guide rails, at least one of rotation of the connecting arm with respect to the first support axis and rotation of the connecting arm with respect to the second support axis is prevented. Thus, the engaging member is prevented from striking the ends of the guide rails.

Further, with the panel device having a support mechanism including an operating member provided on a side section of the panel when an operator moves the panel, it is possible to release the prevention of rotation of the arm by grasping the side section of the panel. This makes it easy for an operator to perform operation to release the prevention of rotation of the arm and operation for moving the panel at the same time, thereby improving usability of the panel device.

Further, with the panel device having the first support axis, the second support axis, the connecting arm, and the regulating arm provided on a rear surface of the panel, the first support axis, the second support axis, the connecting arm, and the regulating arm are provided on a rear surface of the panel. Thus, it is easy to make the external appearance of the front side of the panel device simple.

Further, with the work machine provided with a work machine cover, and the panel positioned in front of the work machine cover when the panel is rotated to the work machine side, when an operator performs maintenance or the like inside the work machine with the work machine cover open, the panel is an extreme nuisance, so the operator will move the panel. Here, there are cases in which work is performed while viewing the panel, so usability worsens if it is no longer possible to view the display screen of the panel due to the panel having been moved. Thus, a panel device for which it is easy to view the display screen of the panel even when the panel is moved is desirable. Thus, with the work machine according to claim 6, the effects of a panel device for which it is easy to view the display screen of the panel even when the panel is moved are sufficiently enabled.

Further, with the work machine according to an aspect above, a device suitable for mounting work, a mounting section for mounting that device, and a panel device are provided, and the mounting section and the panel device are arranged at a specified end of a base. Also, the device suitable for mounting work is configured from a main body section on which the mounting section is mounted, and a slide section that slides in a direction away from the panel device with respect to the main body section. That is, by sliding the slide section in a direction away from the panel device, it is possible to create space in front of the specified end of the base. Also, the panel is able to be moved with the display surface of the panel facing the space. Accordingly, work space is maintained in front of the specified end of the base, and in that work space it is possible for an operator to perform work while comfortably viewing the display screen or the like of the panel.

Description of Preferred Embodiments

Figure 1:
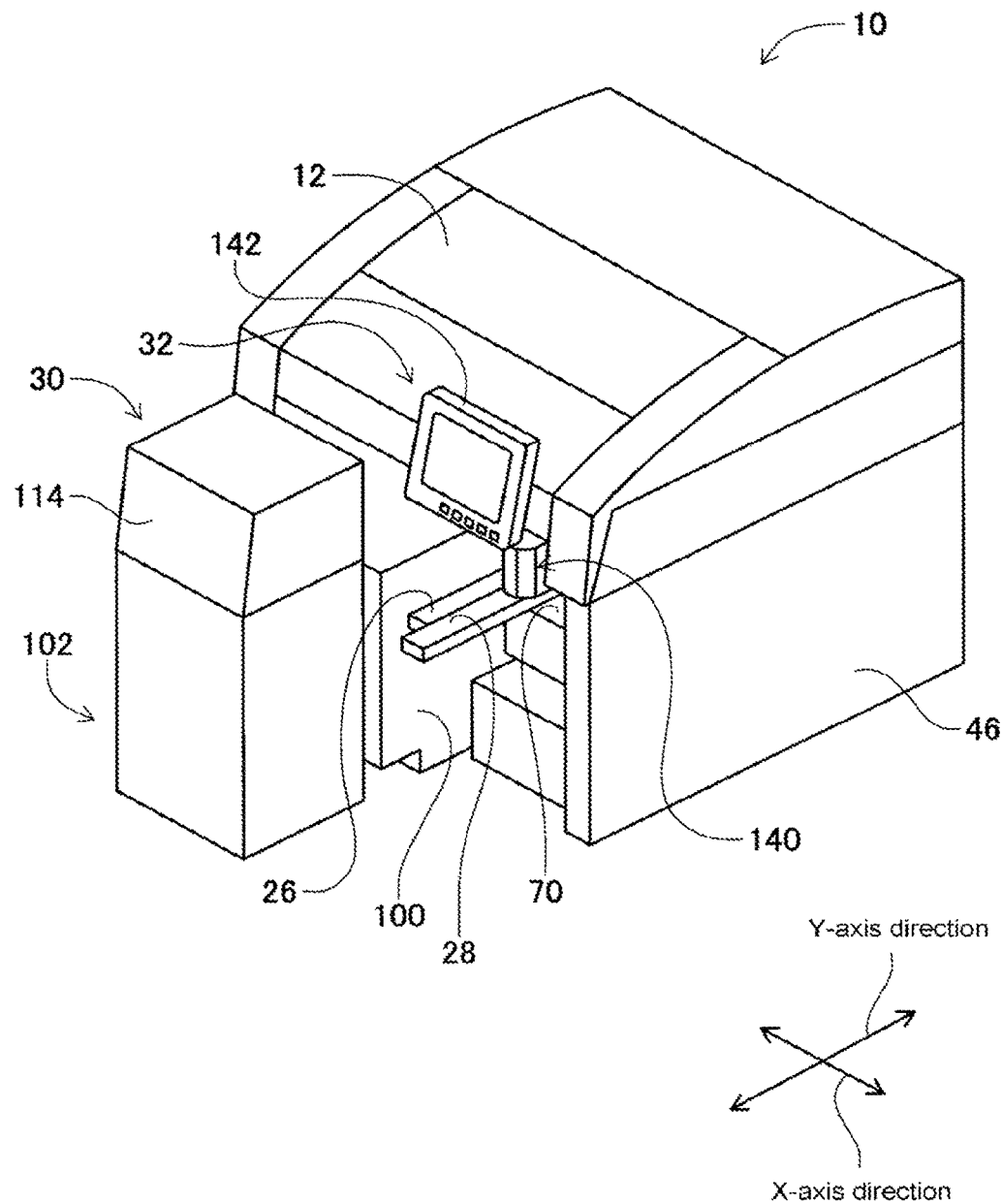
FIG. 1 is a perspective view of an electronic component mounter that is an embodiment of the disclosure.
Figure 2:
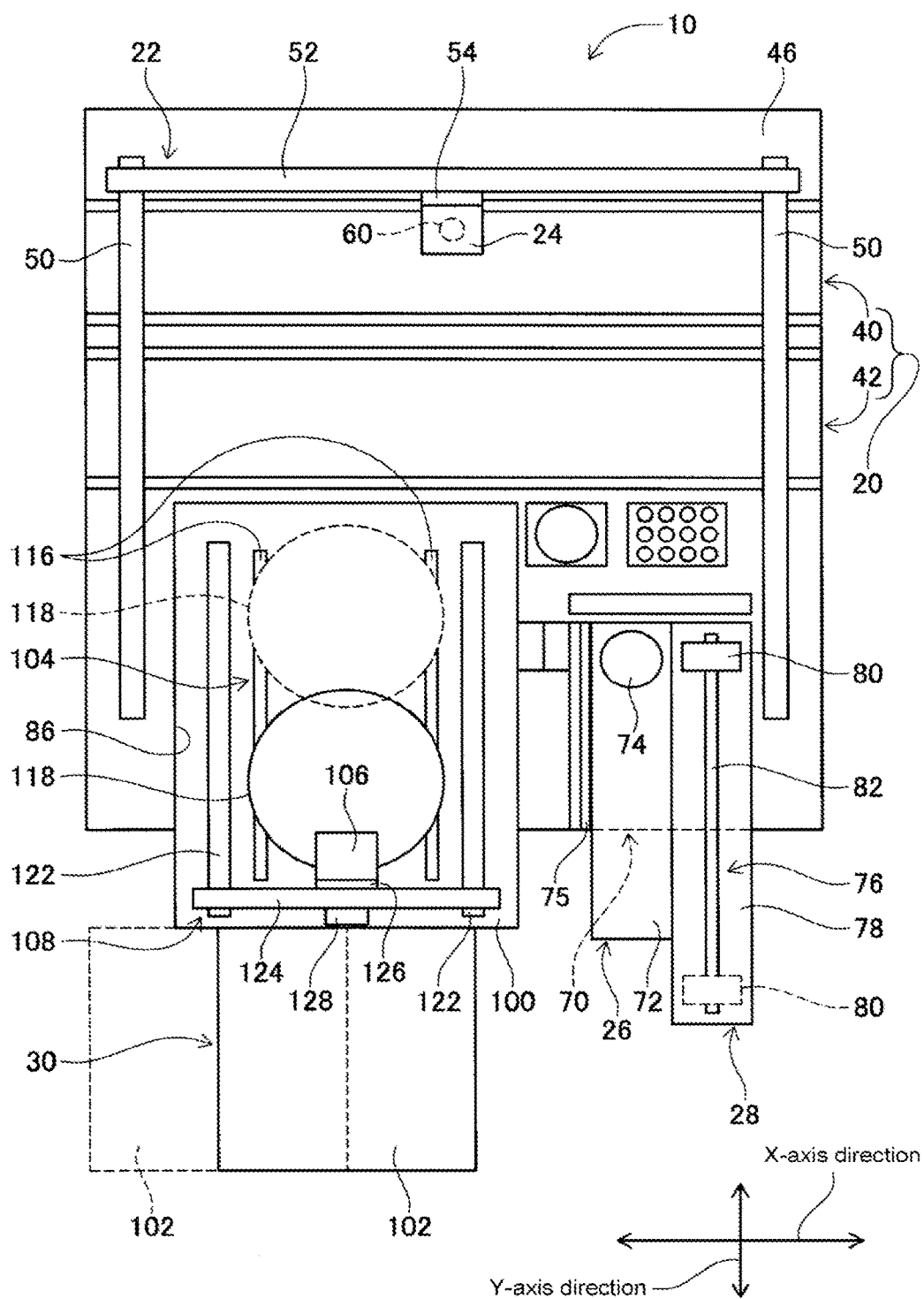
FIG. 2 is a plan view of the electronic component mounter of FIG. 1.

The following describes in detail referring to the figures an example embodiment of the present disclosure.
Configuration of Electronic Component Mounter FIGS. 1 and 2 show electronic component mounter 10 of an embodiment of the present disclosure. FIG. 1 is a perspective view of electronic component mounter 10, and FIG. 2 is a plan view showing electronic component mounter 10 from which cover 12 and the like have been removed. Electronic component mounter 10 is a working machine that mounts electronic components on a circuit board. Electronic component mounter 10 is provided with conveyance device 20, mounting head moving device (hereinafter, referred to as a "moving device") 22, mounting head 24, flux supply device 26, electronic component ejection device 28, die supply device 30, and panel device 32. Note that, in the following description, the width direction of electronic component mounter 10 is referred to as the X-axis direction and a horizontal direction orthogonal to the X-axis direction is referred to as the Y-axis direction.

Conveyance device 20 is provided with conveyor devices 40 and 42. These two conveyor devices 40 and 42 are provided on base 46 parallel to each other and extending in the X-axis direction. Each of the two conveyor devices 40 and 42 conveys a circuit board in the X-axis direction using an electromagnetic motor (not shown). Also, the circuit board is fixedly held at a predetermined position by a board holding device (not shown).

Moving device 22 includes a pair of Y-axis direction guide rails 50 extending in the Y-axis direction and an X-axis direction guide rail 52 extending in the X-axis direction. X-axis direction guide rail 52 is provided on the pair of Y-axis direction guide rails 50. Further, X-axis direction guide rail 52 is moved to any position in the Y-axis direction by the driving of an electromagnetic motor (not shown). Furthermore, X-axis direction guide rail 52 holds slider 54 that can move along an axis line thereof. Slider 54 is moved to any position in the X-axis direction by the driving of an electromagnetic motor (not shown). Mounting head 24 is attached to slider 54. According to such a structure, mounting head 24 is moved to any position on base 46.

Mounting head 24 mounts electronic components on a circuit board. Mounting head 24 includes suction nozzle 60 that is provided on a lower end face of the mounting head. Suction nozzle 60 is connected to a positive/negative pressure supply device (not shown) via a negative pressure air and positive pressure air passage. Suction nozzle 60 picks up and holds an electronic component using negative pressure, and releases the held electronic component using positive pressure. Also, mounting head 24 has a nozzle raising/lowering device (not shown) that raises/lowers suction nozzle 60. Mounting head 24 changes the position of the held electronic component in a vertical direction by the nozzle raising/lowering device. Note that, suction nozzle 60 is detachably mounted on mounting head 24.

Flux supply device 26 is provided at one end of base 46 in the Y-axis direction. In detail, the upper surface of base 46 is formed in a substantially rectangular shape, and device pallet 70 is fixed to the front edge of base 46 in the Y-axis direction. Further, flux supply device 26 is mounted on device pallet 70. Flux supply device 26 includes body base 72 and flux tray 74. Body base 72 is formed in a rectangular shape and extends in the longitudinal direction, and a slide section (not shown) is provided on the back of body base 72. Multiple grooves 75 are formed on the upper surface of device pallet 70 extending in the Y-axis direction. Further, body base 72 is mounted on device pallet 70 by the slide section of body base 72 engaging with grooves 75. Also, body base 72 is detachably mounted on device pallet 70.

Moreover, the rear end of body base 72 extends from base 46. Flux tray 74 is loaded on the upper surface of the front end of body base 72, and flux is stored in flux tray 74. Note that, a solution other than flux, specifically, molten solder or the like can be stored in flux tray 74. Also, body base 72 is provided with a connector (not shown). The connector is connected to a connector connection portion (not shown) of device pallet 70 by body base 72 being mounted on device pallet 70. Accordingly, flux supply device 26 is electrically connected to electronic component mounter 10.

Electronic component ejection device 28 includes moving mechanism 76, body base 78, and loading plate 80. Body base 78 is formed in a rectangular shape and extends in the longitudinal direction, and a slide section (not shown) is provided on the back of body base 78. Further, body base 78 is mounted on device pallet 70 by the slide section engaging with grooves 75 of device pallet 70. Note that, like body base 72 of flux supply device 26, body base 78 of electronic component ejection device 28 is also detachably mounted on device pallet 70.

Further, moving mechanism 76 includes rail 82, and rail 82 is provided on body base 78 extending in the Y-axis direction. Loading plate 80 is supported by rail 82 so as to be slidable in an axial direction thereof, and is moved in the Y-axis direction by the driving of an electromagnetic motor (not shown). Specifically, loading plate 80 is moved between one end of body base 78, which is positioned on base 46, and the other end of body base 78, which extends from base 46.

Also, body base 78 is provided with a connector (not shown). The connector is connected to a connector connection portion of device pallet 70 by body base 78 being mounted on device pallet 70. Accordingly, electronic component ejection device 28 is electrically connected to electronic component mounter 10.

Figure 3:
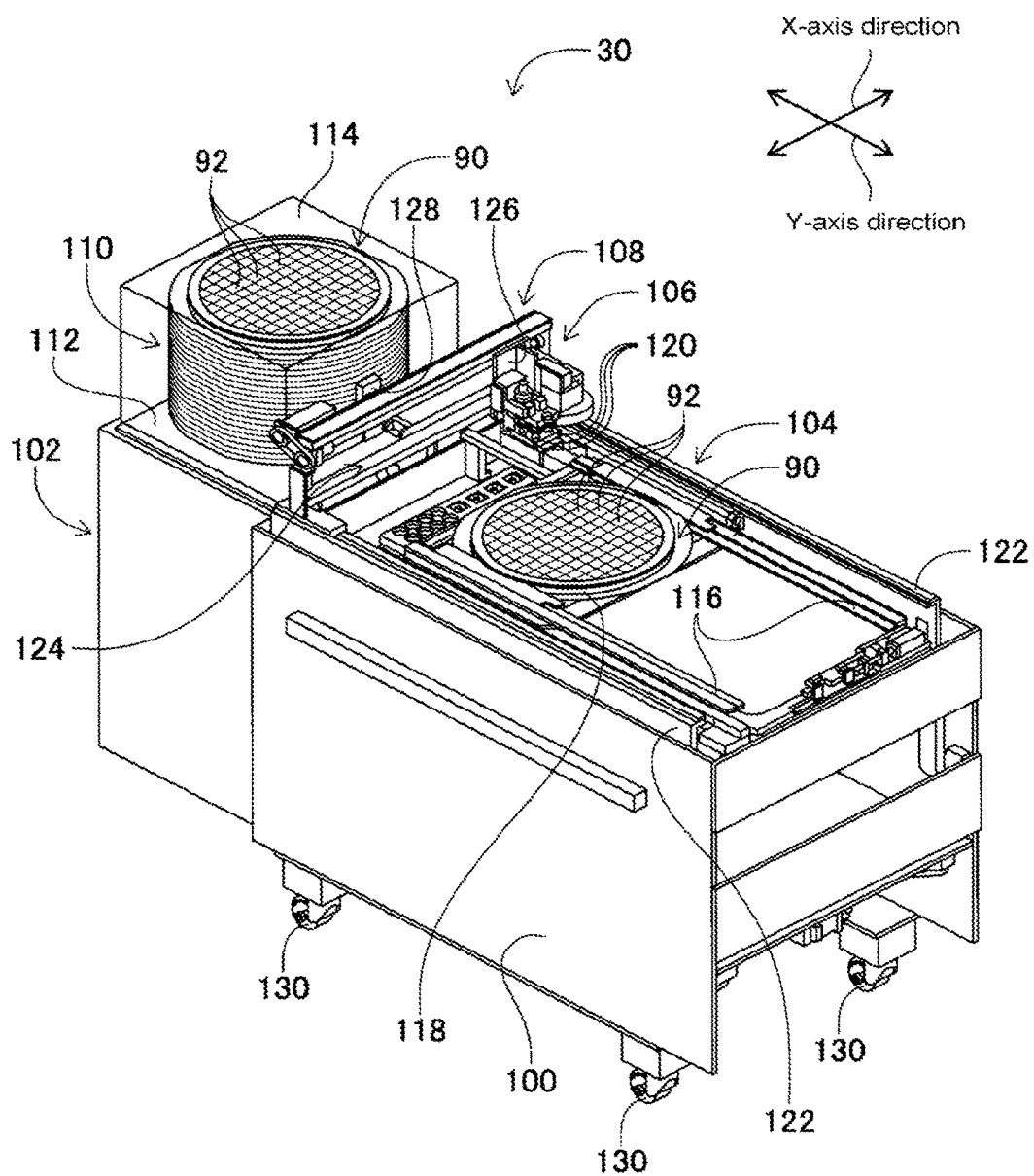
FIG. 3 is a perspective view of the die supply device with which the electronic component mounter of FIG. 1 is provided.

Die supply device 30 is provided at one end of base 46 in the Y-axis direction. In detail, storage section 86 having a recessed shape is formed at an edge of base 46 to which device pallet 70 is fixed, and a portion of die supply device 30 is stored in storage section 86. As shown in FIG. 3, die supply device 30 supplies die 92 from die body 90. Die body 90 is formed by dicing a wafer to which a dicing sheet has been attached.

Die supply device 30 includes main frame 100, die body storage device 102, die body holding device 104, pickup head 106, and pickup head moving device (hereinafter, referred to as a "moving device") 108.

The upper surface of main frame 100 is formed into a substantial rectangle shape, and die body holding device 104, pickup head 106, and moving device 108 are provided on the upper surface. Die supply device 30 is attached to main frame 100 by main frame 100 being stored in storage section 86.

Die body storage device 102 includes rack 110 and raising/lowering table 112. Rack 110 is provided on lifting table 112, and multiple die bodies 90 are stored stacked in rack 110. The multiple die bodies 90 are moved in the vertical direction by raising/lowering table 112 being raised/lowered by a table raising/lowering mechanism (not shown). Further, a die body 90 positioned at a predetermined height is drawn onto die body holding unit 104. The upper portion of rack 110 is covered by rack cover 114. Since rack cover 114 is made of a transparent material, an operator can see the inside of rack 110.

Also, die body storage section 102 is attached to an end of main frame 100 in the Y-axis direction, and when main frame 100 is stored inside storage section 86, die body storage section 102 is positioned outside main frame 100. Further, die body storage device 102 is able to be slid in a direction away from flux supply device 26 or the like with respect to main frame 100. Die body storage device 102 after sliding is shown by the dotted line in FIG. 2. As shown by the drawing, a reasonably large space is maintained in front of electronic component mounter 10 by sliding die body storage device 102. By this, with die supply device 30 mounted on base 46, an operator is able to perform work on die body storage device 104 or the like provided on main frame 100. Also, it is easy to perform work on flux supply device 26 or the like.

Die body holding device 104 includes a pair of guide rails 116 and holding frame 118. The pair of guide rails 116 are provided on main frame 100 extending in the Y-axis direction, and support holding frame 118 such that holding frame 118 is movable in the Y-axis direction. Die body 90 drawn out from die body storage device 102 is held by holding frame 118. Further, die body 90 held by holding frame 118 is moved in the Y-axis direction by a frame moving mechanism (not shown).

Pickup head 106 picks up die 92 from die body 90; multiple suction nozzles 120 are mounted on the lower surface of pickup head 106. Each suction nozzle 120 is connected to a positive/negative pressure supply device (not shown). Suction nozzle 120 picks up and holds die 92 using negative pressure, and releases held die 92 using positive pressure. Further, pickup head 106 is inverted in the vertical direction such that the opening of suction nozzle 120 faces upward. Accordingly, die 92 which has been picked up and held by suction nozzle 120 is supplied at an upper portion of pickup head 106.

Moving device 108 includes a pair of Y-axis direction guide rails 122 extending in the Y-axis direction and an X-axis direction guide rail 124 extending in the X-axis direction. X-axis direction guide rail 124 is provided on the pair of Y-axis direction guide rails 122. Further, X-axis direction guide rail 124 is moved to any position in the Y-axis direction by the driving of an electromagnetic motor (not shown). Also, the X-axis direction guide rail 124 holds slider 126 that can move along an axis line thereof. Slider 126 is moved to any position in the X-axis direction by the driving of an electromagnetic motor (not shown). Pickup head 106 is attached to slider 126. According to such a structure, pickup head 106 is moved to any position on main frame 100.

Clamp 128 is mounted on the back of X-axis direction guide rail 124 of moving device 108. Clamp 128 grips die body 90 stored in rack 110 of the die body storage device 102. That is, die body 90 gripped by clamp 128 is moved in the Y-axis direction by X-axis direction guide rail 124 being moved in the Y-axis direction. Accordingly, die body 90 stored in rack 110 is drawn onto holding frame 118.

Further, casters 130 are attached to the legs of main frame 100 of die supply device 30. Accordingly, die supply device 30 can be easily moved on the floor and die supply device 30 is easily mounted on and detached from storage section 86. Main frame 100 is provided with a connector (not shown), and storage section 86 is provided with a connector connection section (not shown). Accordingly, when die supply device 30 is stored in storage section 86, die supply device 30 is electrically connected to electronic component mounter 10.

Figure 4:
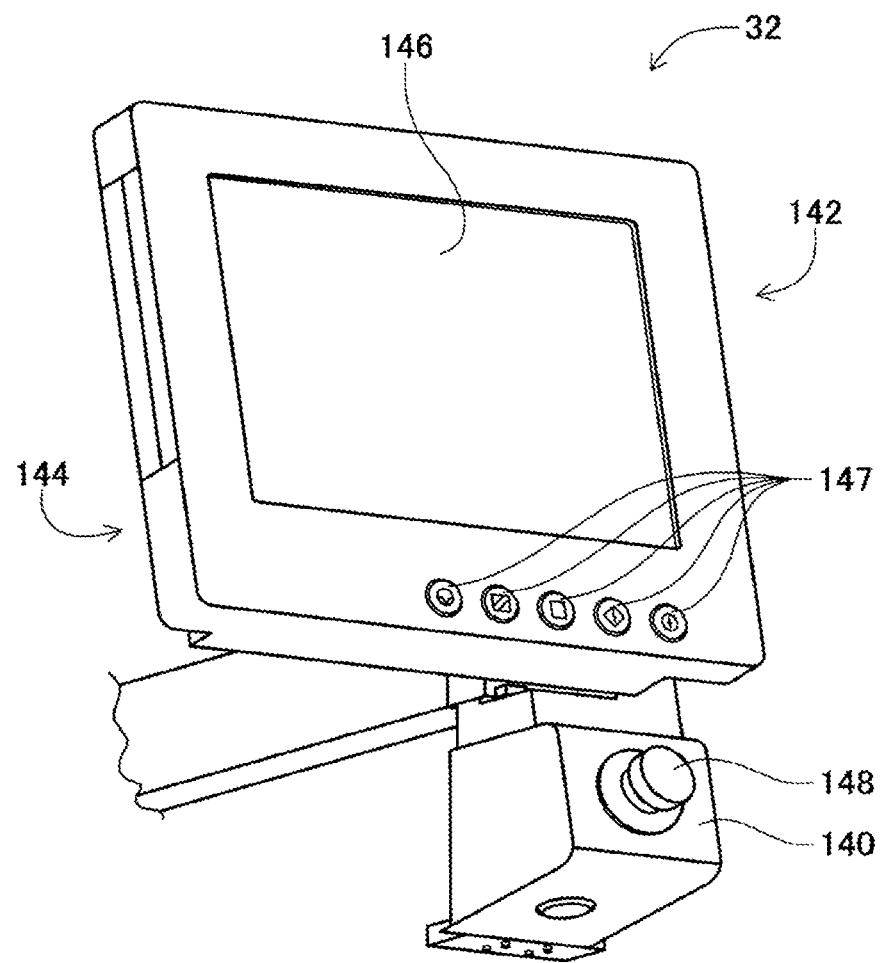
FIG. 4 is a perspective view of the panel device with which the electronic component mounter of FIG. 1 is provided.

As shown in FIG. 1, panel device 32 is supported by bracket 140 provided at the front of cover 12. Panel device 32 includes panel 142, and panel support mechanism (refer to FIGS. 5 and 6) 144 provided on the rear of panel 142. As shown in FIG. 4, display screen 146 is provided on the front of panel 142, and outputs information related to operation of electronic component mounter 10. Also, multiple operation buttons 147 are provided below display screen 146, and input commands for operations of electronic component mounter 10. Note that, multiple operation buttons 147 do not include emergency stop button 148, which is provided on bracket 140. This is such that the position of emergency stop button 148 does not change even when panel 142 is rotated as described below.

Figure 5:
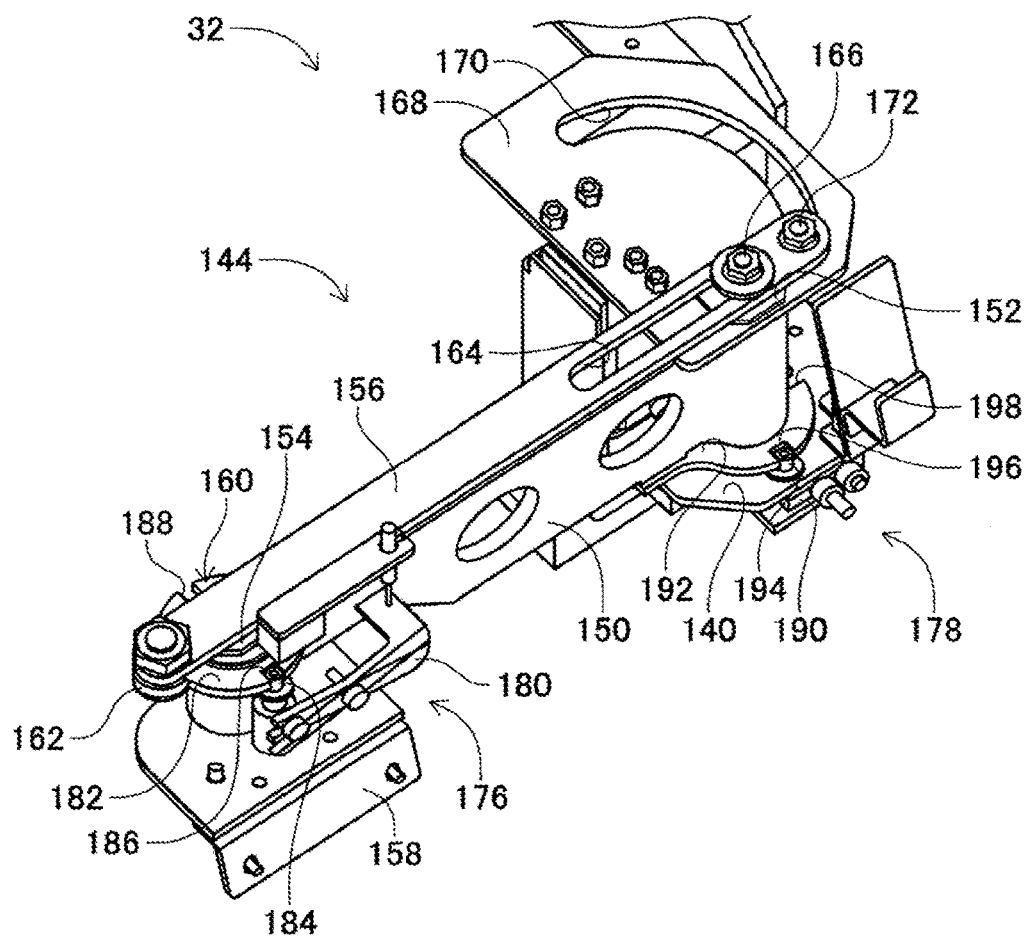
FIG. 5 is a perspective view showing the panel device with the panel removed.
Figure 6:
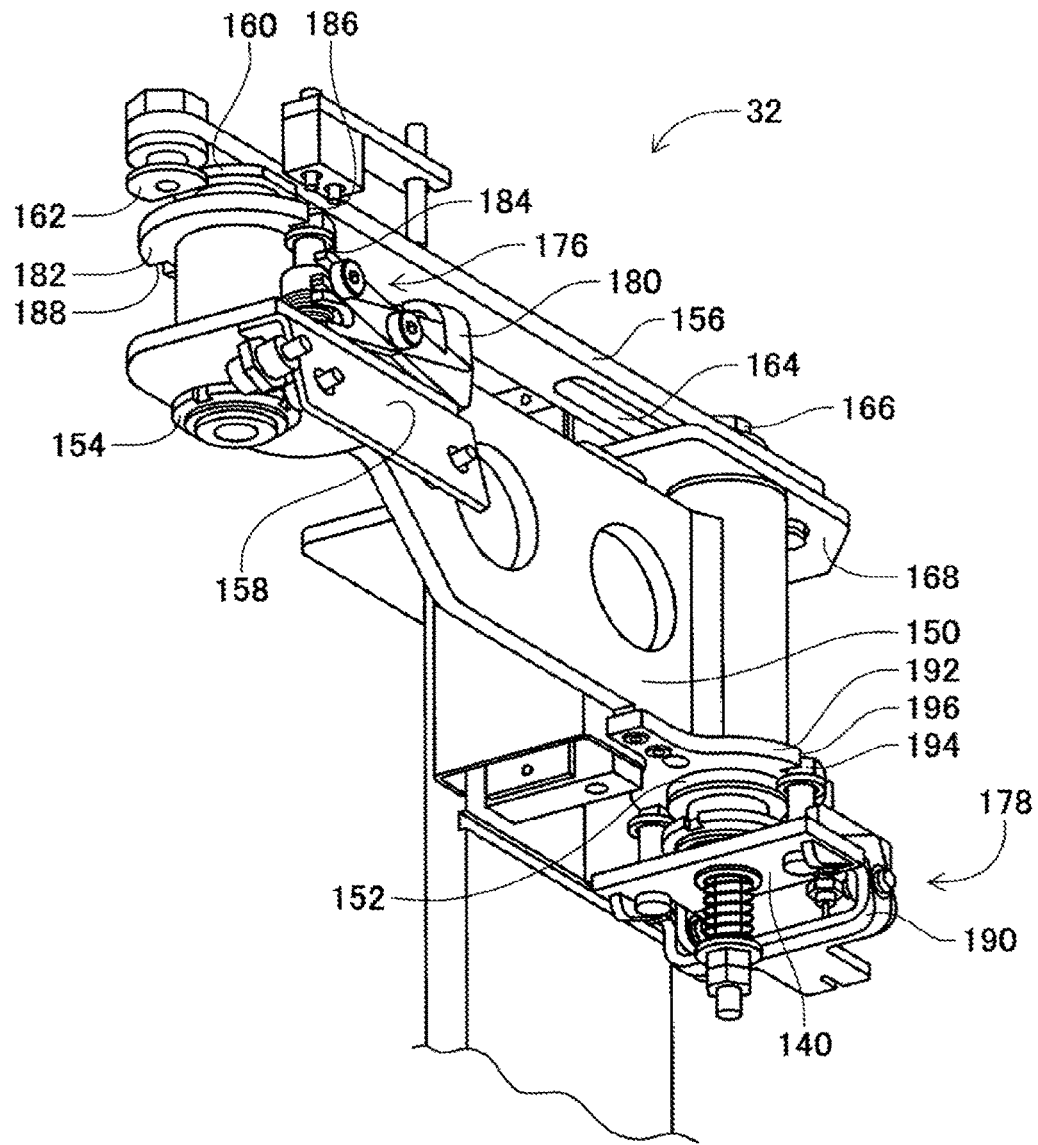
FIG. 6 is a perspective view showing the panel device with the panel removed.

Panel support mechanism 144 supports panel 142 such that panel 142 is rotatable, and as shown in FIGS. 5 and 6, is configured from connecting arm 150, work-machine-side support axis 152, panel-side support axis 154, and regulating arm 156. Panel 142 is attached to fixture 158 fixed to panel-side support axis 154, but in FIGS. 5 and 6 panel support mechanism 144 is shown with panel 142 removed from fixture 158. Note that, when panel 142 is attached to fixture 158, panel support mechanism 144 is positioned at the rear side of panel 142, and as shown in FIG. 4, panel support mechanism 144 cannot be seen from the front.

Panel support mechanism 144 is described in detail below. As shown in FIGS. 5 and 6, work-machine-side support axis 152 of panel support mechanism 144 is fixed to an upper surface of bracket 140 so as to extend in a vertical direction. Work-machine-side support axis 152 holds an end of connecting arm 150 so as to be able to swing. Panel-side support axis 154 extends in the vertical direction at the other end of connecting arm 150 so as to be able to rotate around a center axis. Fixture 158 is fixed below a support section by connecting arm 150 of panel-side support axis 154, and panel 142 is attached to fixture 158. According to this configuration, connecting arm 150 oscillates around work-machine-side support axis 152, and panel-side support axis 154, together with panel 142, rotates around the center axis of panel-side support axis 154 at a tip of connecting arm 150.

Flange section 160 is fixed to an upper section of panel-side support axis 154. Protruding section 162 that protrudes in a diameter direction is formed on the edge of flange section 160, and an end of regulating arm 156 is oscillatably supported on protruding section 162. That is, an end of regulating arm 156 is oscillatable around a position that deviates from the axis line of panel-side support axis 154. Also, elongated hole 164 is formed at the other end of regulating arm 156 extending in the axis line direction of regulating arm 156; the upper end of work-machine-side support axis 152 is connected to elongated hole 164 by bolt 166. By this, the upper end of work-machine-side support axis 152 rotates and slides inside elongated hole 164.

Also, cam forming plate 168 is fixed to the upper end of work-machine-side support axis 152 so as to intersect perpendicular to the axis direction of work-machine-side support axis 152. Guide rail 170 formed substantially in an arc is formed in cam forming plate 168. Guide rail 170 pierces cam forming plate 168 in the vertical direction; bolt 172 is inserted into guide rail 170, and an end of regulating arm 156 is fixed to bolt 172. Thus, bolt 172 slides and rotates inside guide rail 170. Further, regulating arm 156 oscillates around bolt 166, that is, the center of the upper end of work-machine-side support axis 152, by the sliding and rotating of bolt 172 inside guide rail 170.

Further, panel support mechanism 144 includes panel-side lock mechanism 176 for locking the oscillation of connecting arm 150 with respect to panel-side support axis 154, and work-machine-side lock mechanism 178 for locking oscillation of connecting arm 150 with respect to work-machine-side support axis 152. Panel-side lock mechanism 176 is configured from lock arm 180 and flange section 182. Lock arm 180 is provided on the upper surface of fixture 158 so as to be oscillatable in the vertical direction. Flange section 182 is fixed to the end of connecting arm 150 that holds panel-side support axis 154, and is positioned above an end of lock arm 180.

Lock pin 184 is fixed to the end of lock arm 180 so as to extend upwards. Lock arm 180 is biased by a spring (not shown) such that the end at which lock pin 184 is fixed faces up. A pair of recesses 186 and 188 are formed in flange section 182; recess 186 out of the pair of recesses 186 and 188 engages with lock pin 184. Thus, oscillation of connecting arm 150 with respect to panel-side support axis 154 is locked. Note that, the other of the pair of recesses 186 and 188, that is, recess 188, is formed on the opposite side to recess 186. In other words, recess 188 is formed at a position 180 degrees rotated from recess 186. Therefore, when connecting arm 150 in the state shown in the figure is oscillated 180 degrees with respect to panel-side support axis 154, lock pin 184 engages with recess 188.

Also, work-machine-side lock mechanism 178 is configured from lock arm 190 and flange section 192. Lock arm 190 is provided on bracket 140 so as to be oscillatable in the vertical direction. Flange section 192 is fixed to the end of connecting arm 150 that holds work-machine-side support axis 152, and is positioned above an end of lock arm 190.

Lock pin 194 is fixed to the end of lock arm 190 so as to extend upwards. Lock arm 190 is biased by a spring (not shown) such that the end at which lock pin 194 is fixed faces up. A pair of recesses 196 and 198 are formed in flange section 192; recess 196 out of the pair of recesses 196 and 198 engages with lock pin 194. Thus, oscillation of connecting arm 150 with respect to work-machine-side support axis 152 is locked. Note that, the other of the pair of recesses 196 and 198, that is, recess 198, is formed at a position rotated 90 degrees from recess 196. Therefore, when connecting arm 150 in the state shown in the figure is oscillated 90 degrees with respect to work-machine-side support axis 152, lock pin 194 engages with recess 198.

Figure 7:
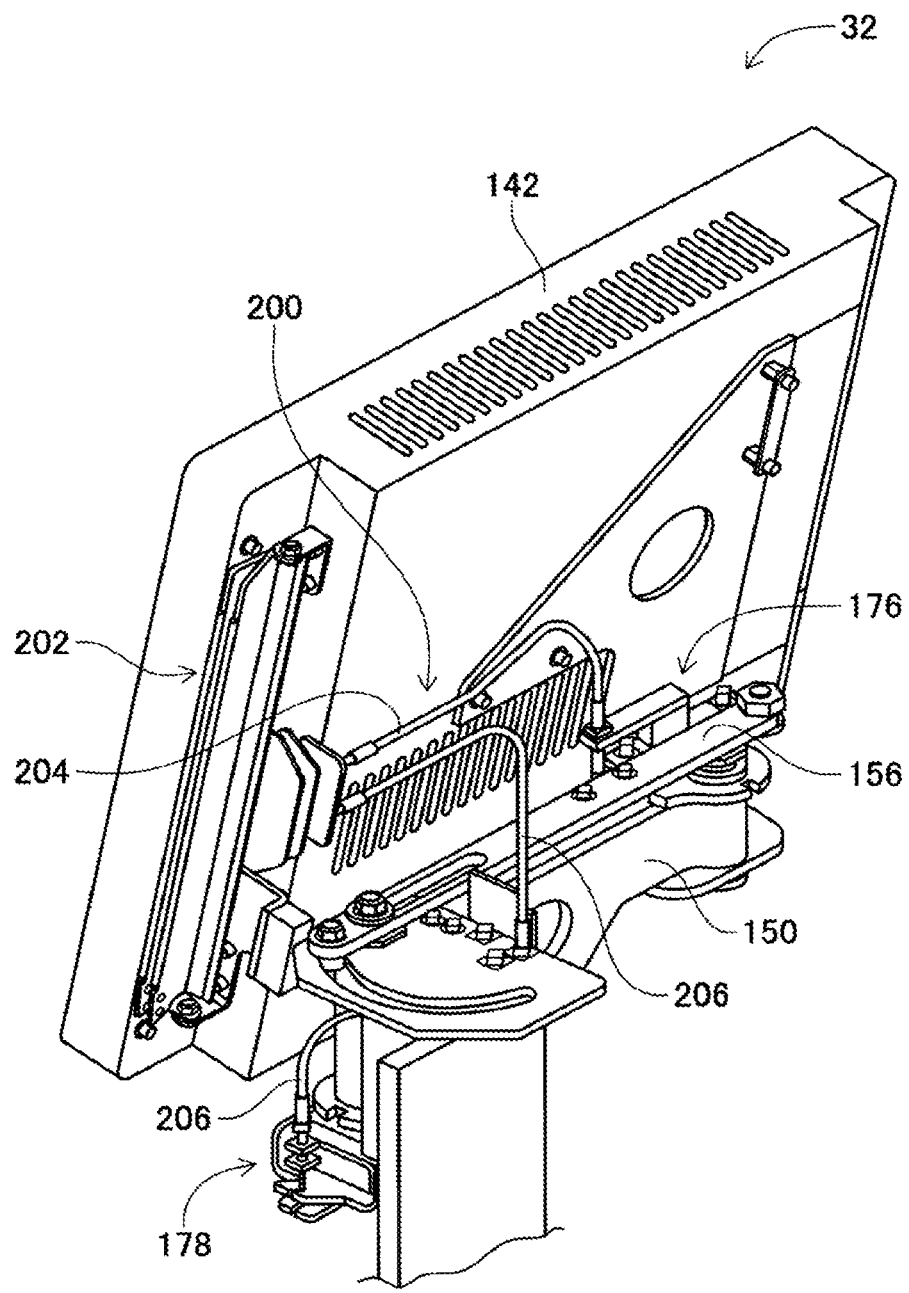
FIG. 7 is a perspective view showing the panel device from the rear side.

Also, lock release mechanism 200 is provided on panel support mechanism 144. Lock release mechanism 200 is for releasing the locking of the oscillation of connecting arm 150 by panel-side lock mechanism 176 and work-machine-side lock mechanism 178. As shown in FIG. 7, lock release mechanism 200 is configured from release lever 202 and two release wires 204 and 206. Release lever 202 is provided on a side of panel 142, and is configured to be operated when an operator grips the side of panel 142.

Note that, a recess extending in the vertical direction is formed on the side surface of panel 142 on which release lever 202 is provided and the opposite side surface such that panel 142 is made slim. Also, the surface of the display screen 146 side of panel 142 is black, but the side and rear surfaces of panel 142 are silver. By making the side and rear surfaces of panel 142 a light color, panel 142 is made visually light.

Also, release wire 204 of lock release mechanism 200 is connected to lock arm 180 of panel-side lock mechanism 176; release wire 206 is connected to lock arm 190 of work-machine-side lock mechanism 178. By operating release lever 202, release wire 204 oscillates lock arm 180 in a direction against the biasing force of the spring, and release wire 206 oscillates lock arm 190 in a direction against the biasing force of the spring. Thus, by operating release lever 202, the locking of the oscillation of connecting arm 150 by panel-side lock mechanism 176 and work-machine-side lock mechanism 178 is released.

With panel device 32 configured as described above, by rotating panel 142 in a direction away from electronic component mounter 10, it is possible to change the position of panel 142 and the facing direction of display screen 146. The position of panel and facing direction of display screen 146 when the panel is rotated will be described in detail with reference to FIGS. 8 to 15. FIGS. 8, 10, 12, and 14 are plan views of panel device 32; FIGS. 9, 11, 13, and 15 are perspective views of panel 32 from diagonally above.

Figure 8:
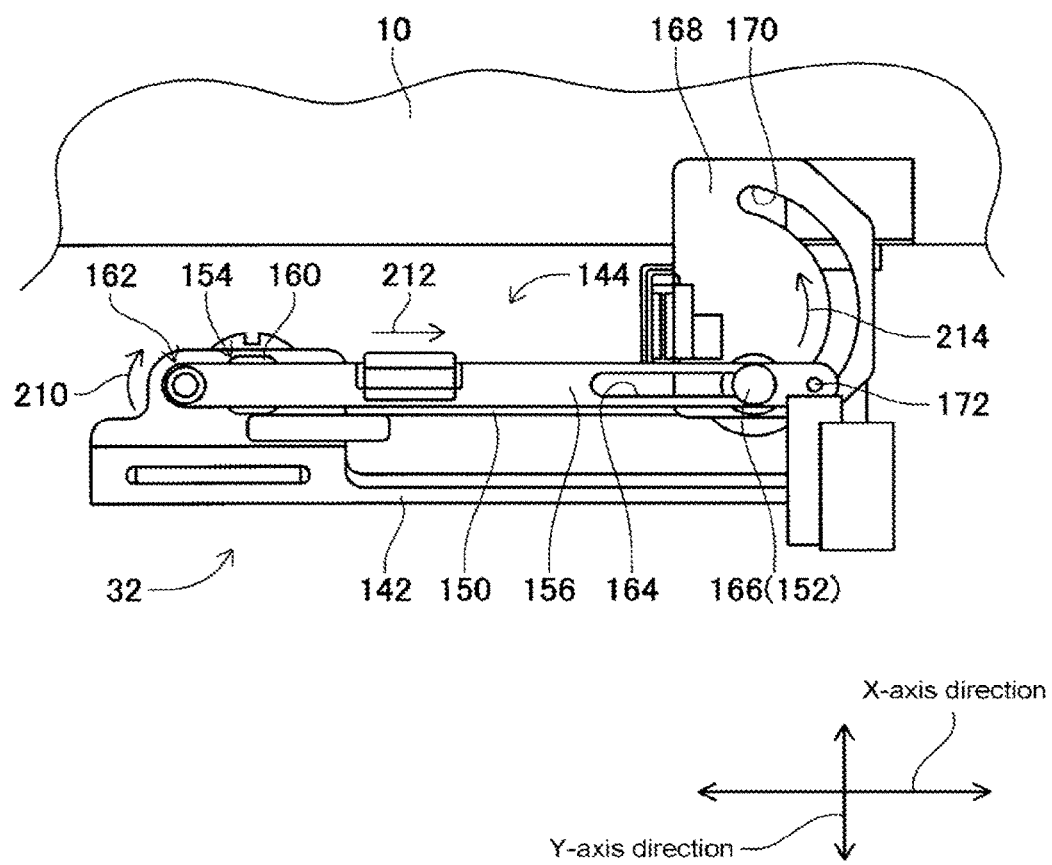
FIG. 8 is a plan view of the panel device before the panel is rotated.
Figure 9:
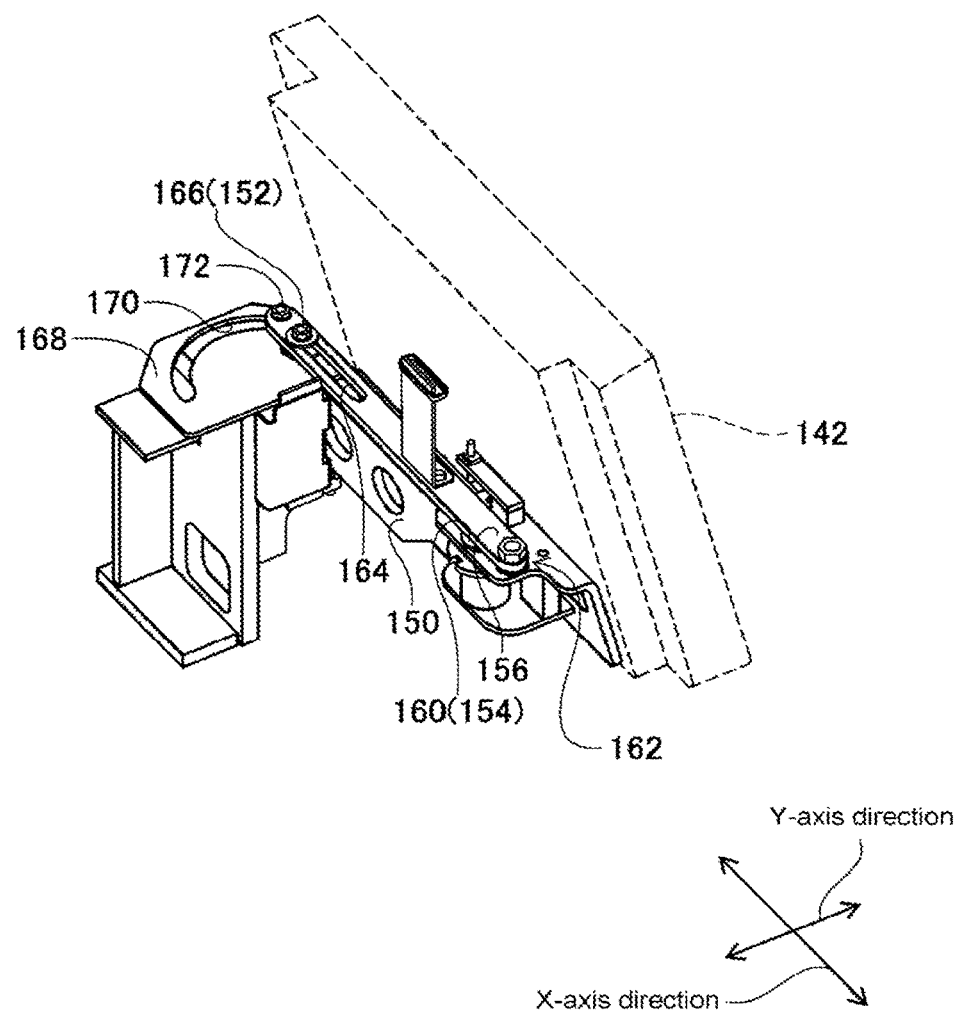
FIG. 9 is a perspective view showing the panel device of FIG. 8 from diagonally above.

First, as shown in FIGS. 8 and 9, before panel 142 is rotated, connecting arm 150 and regulating arm 156 are positioned in front of electronic component mounter 10 extending in the X-axis direction. Thus, display screen 146 of panel 142 is facing forwards from electronic component mounter 10. Note that, because operators often perform work in work area 169 (refer to FIG. 16) positioned in front of electronic component mounter 10, it is possible for an operator to perform work while checking display screen 146.

Also, with panel support mechanism 144 in the state shown in FIGS. 8 and 9, lock pin 184 of panel-side lock mechanism 176 is engaged with recess 186 of flange section 182, and lock pin 194 of work-machine-side lock mechanism 178 is engaged with recess 196 of flange section 192. By this, oscillation of connecting arm 150 is prevented. That is, at the other end of regulating arm 156, in a case in which bolt 172 is positioned at the front end of guide rail 170, the further movement to the front of bolt 172 should be regulated, hence the oscillation of connecting arm 150 is prevented.

Also, when an operator moves panel 142, the operator operates release lever 202 when gripping the side of panel 142, and releases the locking of the oscillation of connecting arm 150 as described above. Further, when an operator pulls panel 142 towards herself, that is, pulls panel 142 away from electronic component mounter 10, panel-side support axis 154 rotates in a direction shown by arrow 210, that is, clockwise in the figure. Thus, flange section 160 fixed to the upper end of panel-side support axis 154 rotates in the direction shown by arrow 210 along with protruding section 162.

By this, the end of regulating arm 156 connected to protruding section 162 also moves in the direction shown by arrow 210. In this case, on regulating arm 156, force is applied to bolt 166 in the direction shown by arrow 212, that is, along the axis line of regulating arm 156. By this, regulating arm 156 moves towards bolt 166, that is, towards work-machine-side support axis 152, and the upper end of work-machine-side support axis 152 slides inside elongated hole 164. Further, at the other end of regulating arm 156, bolt 172 slides inside guide rail 170 in the direction of arrow 214, that is, in the direction towards electronic component mounter 10.

Figure 10:
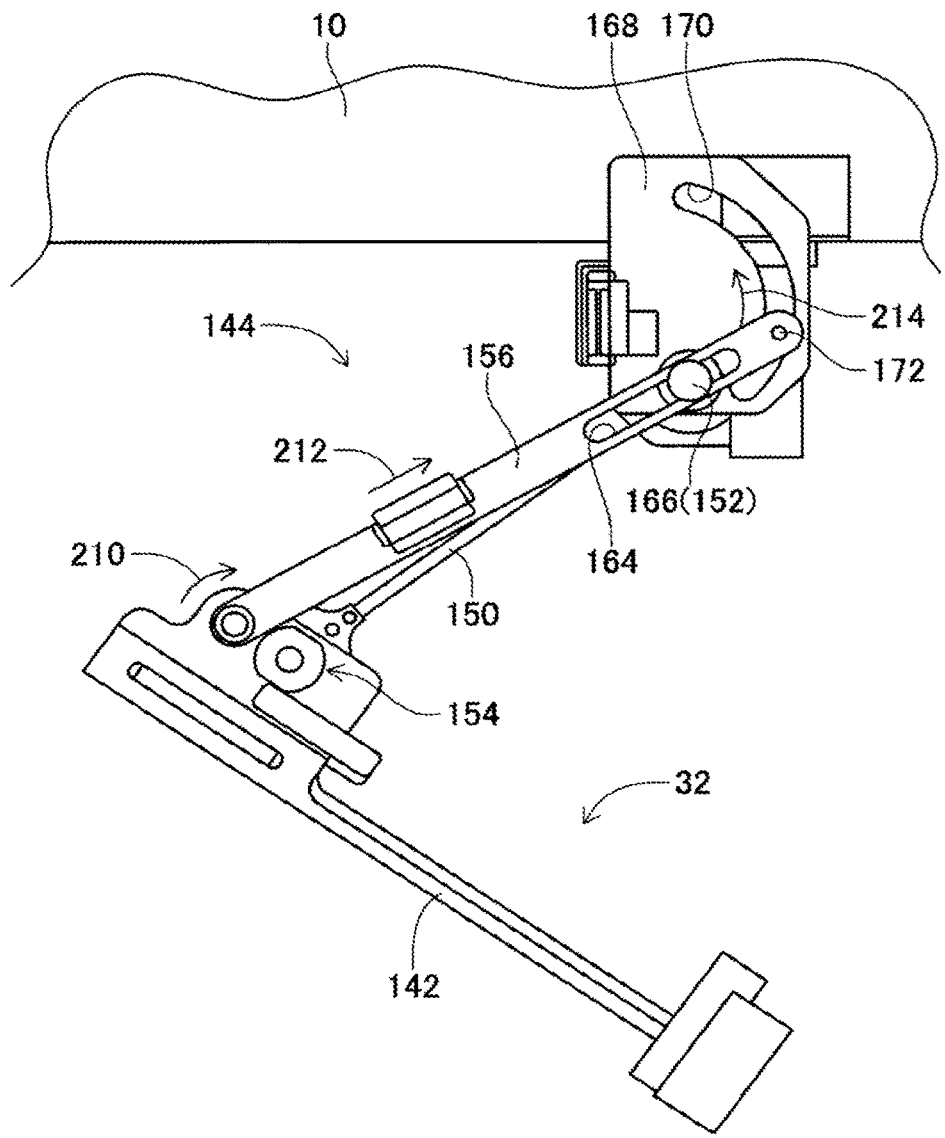
FIG. 10 is a plan view of the panel device as the panel is rotated.
Figure 10:
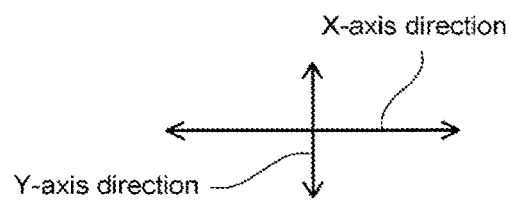
Figure 11:
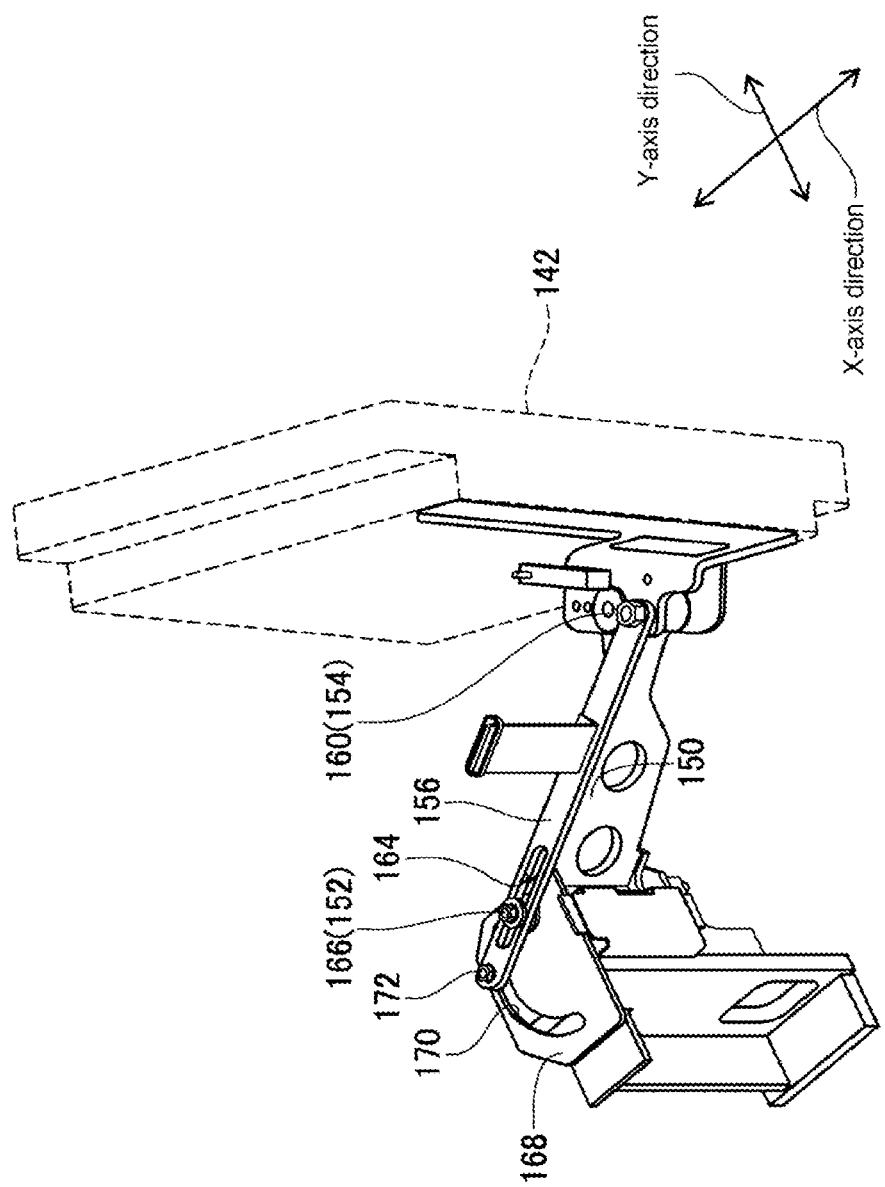
FIG. 11 is a perspective view showing the panel device of FIG. 10 from diagonally above.

As shown in FIGS. 10 and 11, by oscillating regulating arm 156 in this way, connecting arm 150 is swung in a direction away from electronic component mounter 10. In this case, panel 142 rotates in the direction shown by arrow 210 around the axis line of panel-side support axis 154, thus moving panel 142 with display screen 146 facing work area 169.

Figure 12:
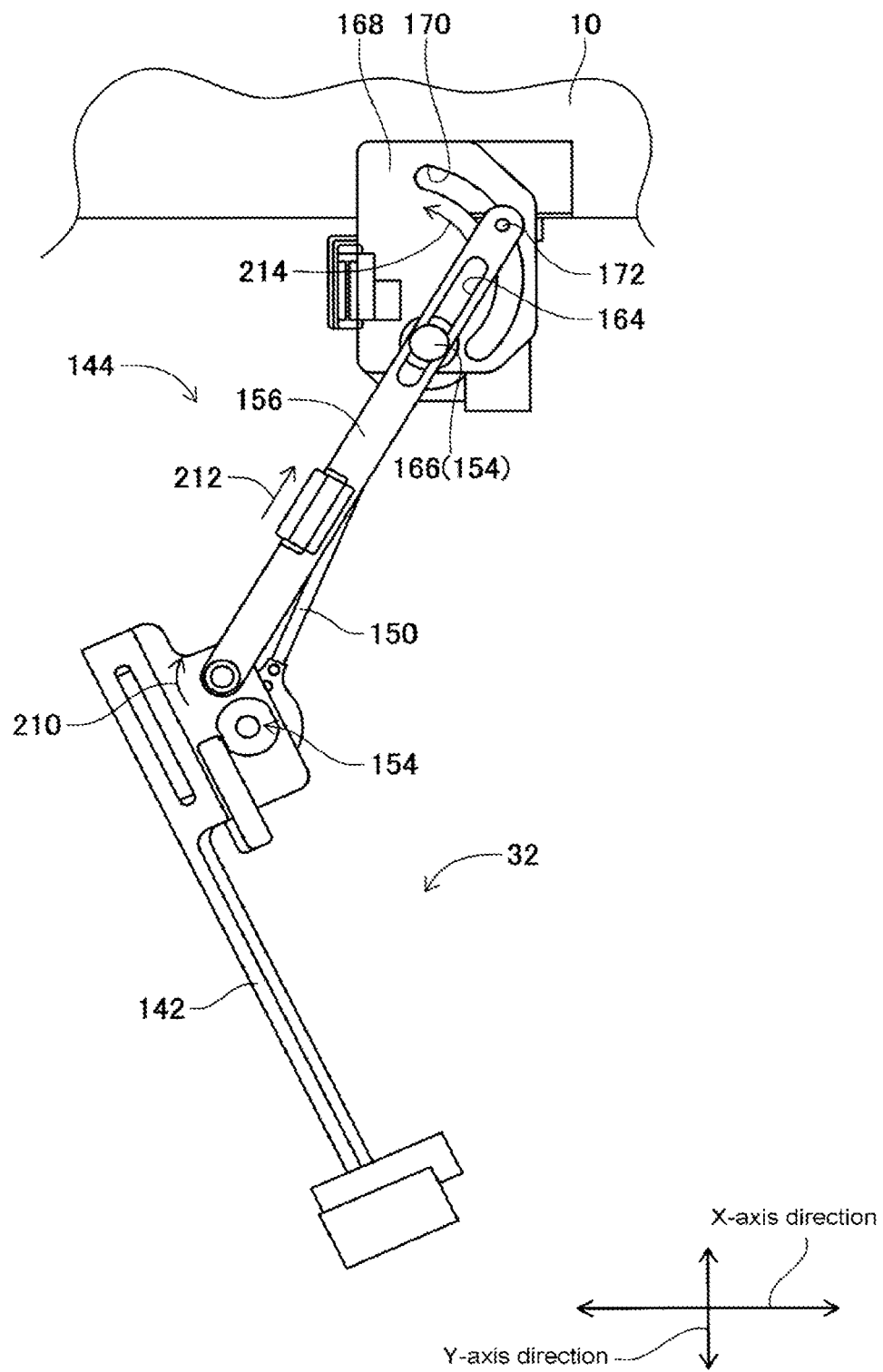
FIG. 12 is a plan view of the panel device as the panel is rotated.
Figure 13:
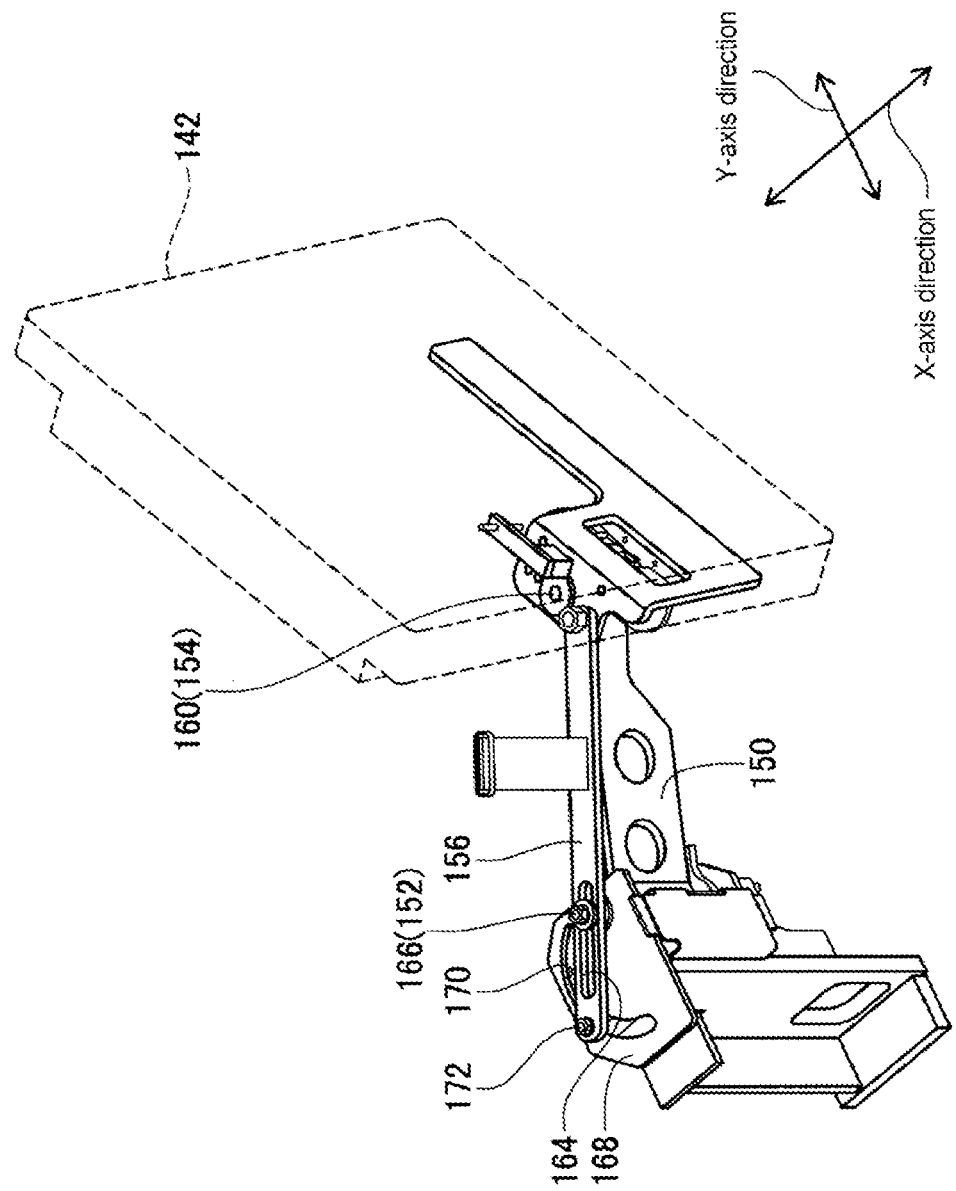
FIG. 13 is a perspective view showing the panel device of FIG. 12 from diagonally above.

Also, when an operator moves panel 142 further away from electronic component mounter 10, panel-side support axis 154 rotates further in the direction shown by arrow 210, and the end of regulating arm 156 connected to protruding section 162 of panel-side support axis 154 also moves further in the direction shown by arrow 210. In this case, regulating arm 156 moves further towards work-machine-side support axis 152, and at the other end of regulating arm 156, bolt 172 slides inside guide rail 170 further in the direction shown by arrow 214. By this, as shown in FIGS. 12 and 13, regulating arm 156 oscillates, and connecting arm 150 swings further in a direction away from electronic component mounter 10. In this case, panel 142 rotates in the direction shown by arrow 210 around the axis line of panel-side support axis 154, thus moving panel 142 with display screen 146 facing work area 169.

Figure 14:
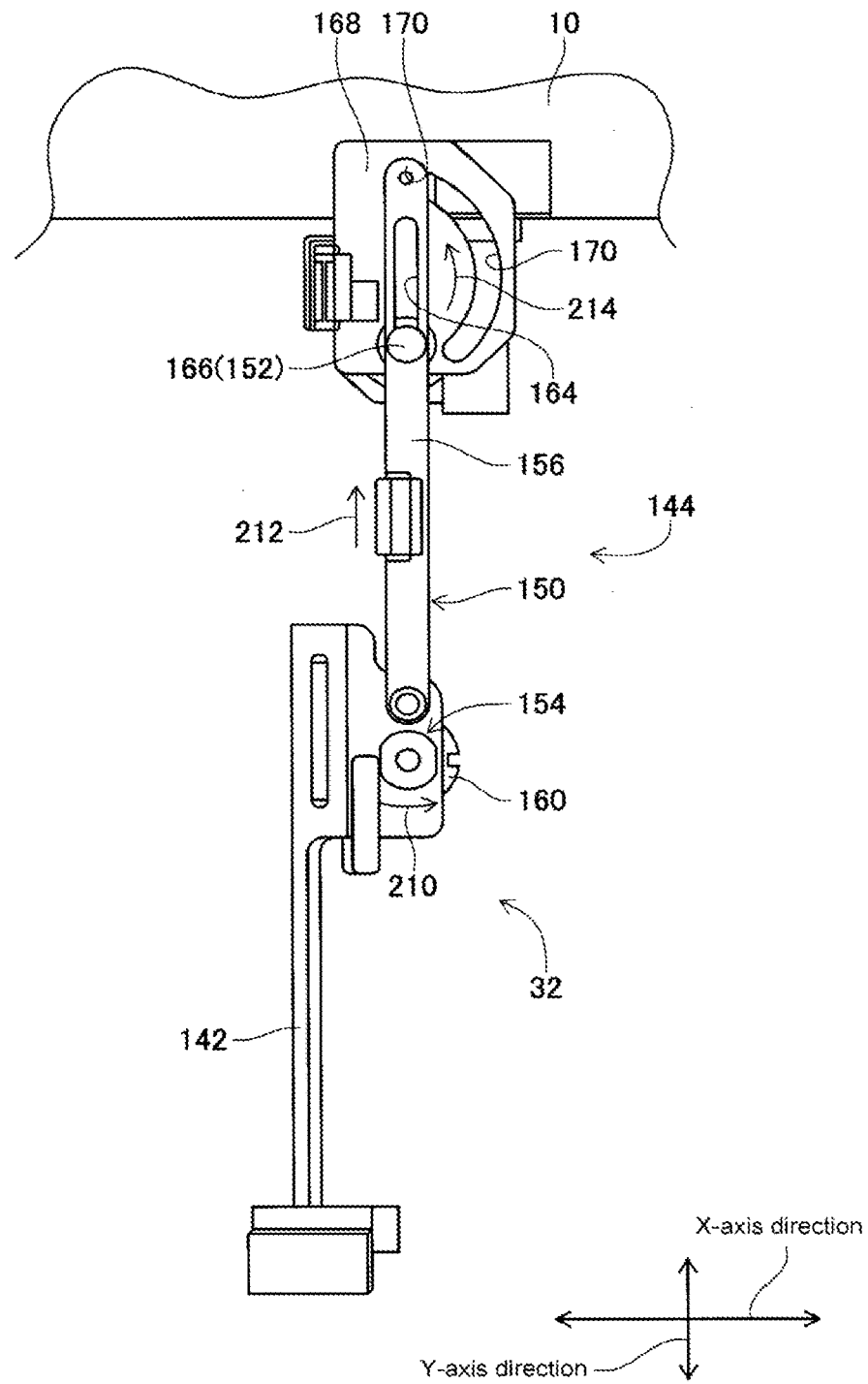
FIG. 14 is a plan view of the panel device after the panel is rotated.
Figure 15:
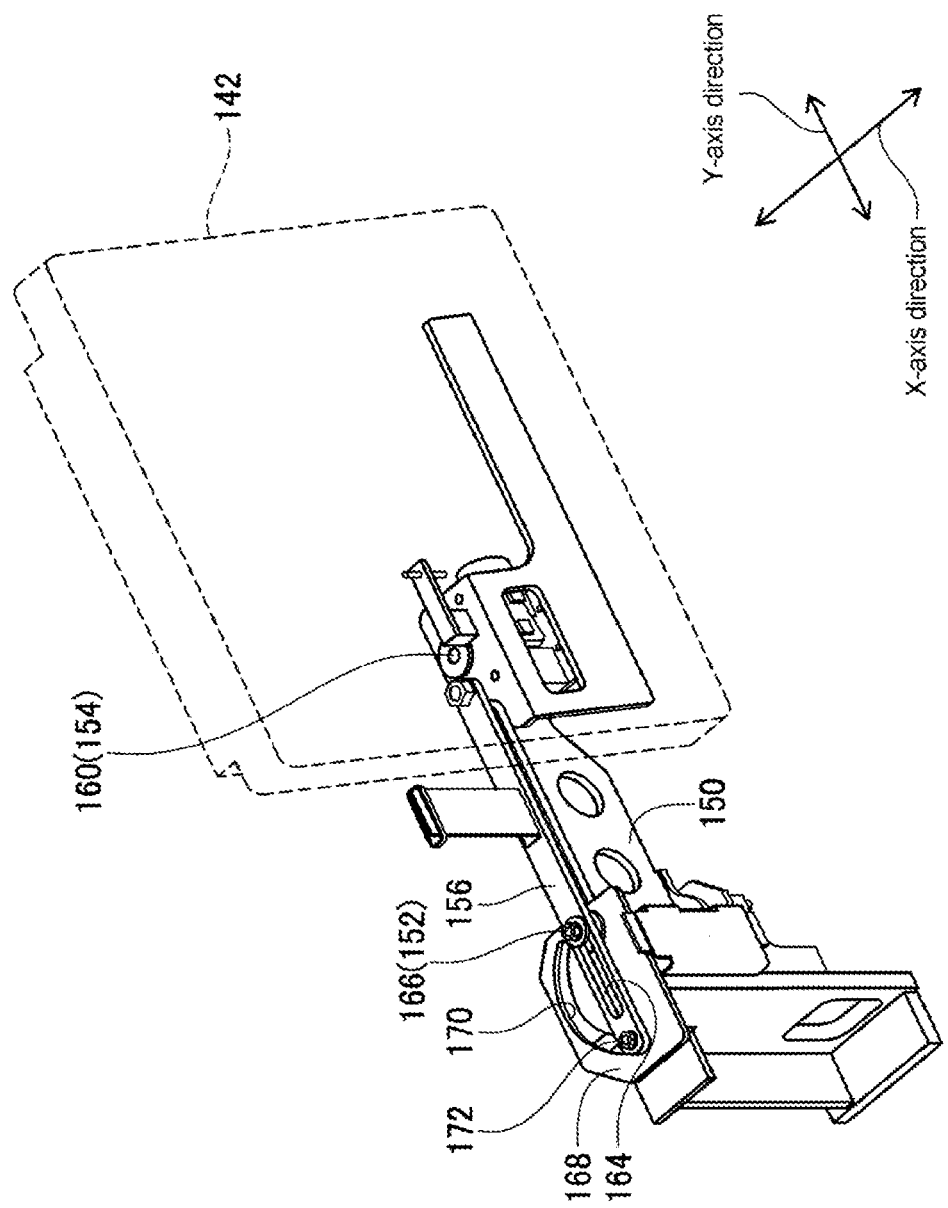
FIG. 15 is a perspective view showing the panel device of FIG. 14 from diagonally above.

Further, as shown in FIGS. 14 and 15, when an operator moves panel 142 further away from electronic component mounter 10, regulating arm 156 oscillates, and connecting arm 150 oscillates based on the oscillation of regulating arm 156. In this case, panel 142 rotates in the direction shown by arrow 210 around the axis line of panel-side support axis 154, and is rotated 90 degrees from a state facing forwards, that is, from the state of panel 142 shown in FIGS. 7 and 9. With panel 142 rotated 90 degrees as well, display screen 146 faces work area 169.

Note that, when panel 142 is rotated 90 degrees, that is, when panel 142 in the state shown in FIGS. 7 and 8 is rotated to a position of panel 142 in the state shown in FIGS. 14 and 15, panel 142 is rotated 180 degrees with respect to connecting arm 150. In other words, connecting arm 150 is rotated 180 degrees with respect to panel-side support axis 154. Also, when panel 142 is rotated 90 degrees, connecting arm 150 is rotated 90 degrees with respect to work-machine-side support axis 152. Thus, with panel support mechanism 144 in the state shown in FIGS. 14 and 15, lock pin 184 of panel-side lock mechanism 176 is engaged with recess 186 of flange section 182, and lock pin 194 of work-machine-side lock mechanism 178 is engaged with recess 196 of flange section 192. By this, oscillation of connecting arm 150 is prevented. That is, at the other end of regulating arm 156, in a case in which bolt 172 is positioned at the rear end of guide rail 170, the further movement to the rear of bolt 172 should be regulated, hence the oscillation of connecting arm 150 is prevented.

In this manner, with panel device 32, by moving panel 142 away from electronic component mounter 10, connecting arm 150 is oscillated away from electronic component mounter 10 and it is possible to move panel 142 with display screen 146 facing work area 169. This improves the usability of electronic component mounter 10.

Specifically, with electronic component mounter 10, as shown in FIG. 1, pre-rotation panel 142 is positioned in front of cover 12 and above flux supply device 26 and the like. Also, pre-rotation panel 142 is arranged in a state aligned with cover 12 thereby obstructing the area above flux supply device 26 and the like. Therefore, pre-rotation panel 142 is an extreme nuisance when an operator performs maintenance of flux supply device 26 and the like, or maintenance and so on inside electronic component mounter 10 with cover 12 open.

Figure 16:
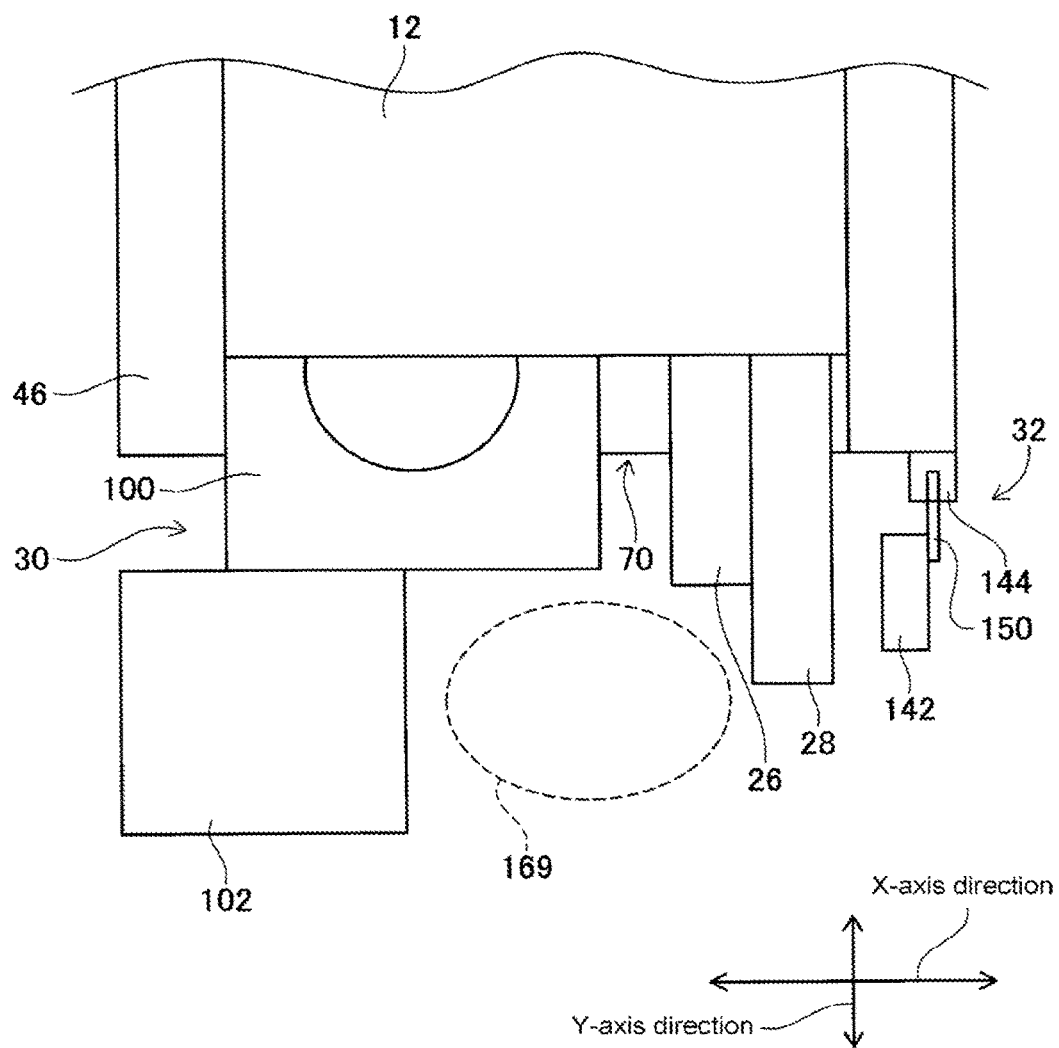
FIG. 16 is a plan view of the panel device after rotation of the panel and a die supply device in a state in which a die body storage device has been slid.

However, by rotating panel 142, as shown in FIG. 16, panel 142 is positioned at an angle to cover 12, with the orientation of panel 142 being substantially perpendicular with respect to cover 12. By this, an operator is able to easily perform maintenance of flux supply device 26 and the like, or maintenance and so on inside electronic component mounter 10 with cover 12 open. Also, as described above, display screen 146 faces work area 169 even after panel 142 has been rotated. Thus, the operator is able to perform maintenance and so on while checking display screen 146, significantly improving usability.

Further, as shown in FIG. 16, die body storage device 102 of die supply device 30 is slidable with respect to main frame 100. This allows work area 169 of a relatively large size to be secured in front of electronic component mounter 10, thus improving usability of each device. In particular, as described above, flux supply device 26 and electronic component ejection device 28 are removable from device pallet 70. Thus, it is easy to perform removal and attachment work of flux supply device 26 and the like due to the relatively large work area 169.

Also, an operator is able to perform the movement of panel 142 described above with one hand, thus usability is good. Further, when the oscillation of connecting arm 150 is locked, an operator is able to release the locking of the oscillation of connecting arm 150 by gripping the sides of panel 142, thus usability is extremely good.

Also, for example, it is possible to change the oscillation path of connecting arm 150 and regulating arm 156 by changing the shape of guide rail 170. That is, it is possible to move panel 142 in various ways simply by exchanging cam forming plate 168, which is extremely convenient.

Note that, in the above embodiments, electronic component mounter 10 is an example of a work machine. Cover 12 is an example of a work machine cover. Die supply device 30 is an example of a mounting work device. Panel device 32 is an example of a panel device. Base 46 is an example of a base. Storage section 86 is an example of a mounting section. Main frame 100 is an example of a main body section. Die body storage device 102 is an example of a slide section. Panel 142 is an example of a panel. Panel support mechanism 144 is an example of a support mechanism. Connecting arm 150 is an example of a connecting arm. Work-machine-side support axis 152 is an example of a first support axis. Panel-side support axis 154 is an example of a second support axis. Regulating arm 156 is an example of a regulating arm. Guide rail 170 is an example of a guide rail. Bolt 172 is an example of an engaging member. Panel-side lock mechanism 176 and work-machine-side lock mechanism 178 are each an example of a rotation prevention mechanism. Release lever 202 is an example of an operating member.

Further, the present disclosure is not limited to the above example embodiments, and various changed or improved methods of embodiment are possible based on the knowledge of someone skilled in the art. Specifically, for example, in the above embodiment, cam forming plate 168 is fixed to work-machine-side support axis 152; however, cam forming plate 168 may be fixed to panel-side support axis 154. In this case, an end of regulating arm 156 is connected to guide rail 170 of cam forming plate 168 by bolt 172, and the other end of regulating arm 156 is oscillatably connected to work-machine-side support axis 152. Further, panel-side support axis 154 is connected to elongated hole 164 of regulating arm 156 by bolt 166.

Also, in the above embodiment, die supply device 30 stored in storage section 86 is used as a mounting work device; however, flux supply device 26 or the like mounted on device pallet 70 may be used as a mounting work device. In other words, a device including a main body section and a slide section may be mounted on device pallet 70 as a mounting work device.

REFERENCE SIGNS LIST

10: electronic component mounter (work machine); 12: cover (work machine cover); 30: die supply device (mounting work device); 32: panel device; 46: base; 86: storage section (mounting section); 100: main frame (main body section); 102: die body storage device (slide section); 142: panel; 144: panel support mechanism; 150: connecting arm; 152: work-machine-side support axis (first support axis); 154: panel-side support axis (second support axis); 156: regulating arm; 170: guide rail; 172: bolt (engaging member); 176: panel-side lock mechanism (rotation prevention mechanism); 178: work-machine-side lock mechanism (rotation prevention mechanism); 202: release lever (operating member).

The invention claimed is:

1. A panel device comprising:
a panel for performing at least one of input and output of information related to operation of a work machine; and
a support mechanism that rotatably supports the panel, wherein the support mechanism includes
a first support axis fixed to the work machine,
a second support axis fixed to the panel,
a connecting arm that is swingably held by the first support axis and the second support axis and connects the first support axis and the second support axis,
a guide rail formed on one of the work machine and the panel,
an engaging member engaged with the guide rail that moves along the guide rail, and
a regulating arm attachable to the engaging member and held on the other of the work machine and the panel so as to be oscillatable by one of the first support axis and the second support axis, and
wherein when the panel rotates, a rotation angle of the connecting arm with respect to the first support axis and the rotation angle of the connecting arm with respect to the second support axis are regulated by the regulating arm.

2. The panel device according to claim 1, wherein the support mechanism further comprises a rotation prevention mechanism that prevents at least one of rotation of the connecting arm with respect to the first support axis, and rotation of the connecting arm with respect to the second support axis.

3. The panel device according to claim 2, wherein the rotation prevention mechanism, when the engaging member moves to at least one end of the guide rail, prevents at least one of rotation of the connecting arm with respect to the first support axis, and rotation of the connecting arm with respect to the second support axis.

4. The panel device according to claim 2, wherein the support mechanism further comprises an operating member operated when releasing prevention of rotation of the connecting arm by the rotation prevention mechanism, and the operating member is provided on a side section of the panel.

5. The panel device according to claim 1 wherein the first support axis, the second support axis, the connecting arm, and the regulating arm are provided on a rear surface of the panel.

6. The panel device according to claim 1, wherein the work machine is provided with a work machine cover that covers an upper portion of the work machine, and the panel moves in front of the work machine cover when the panel is rotated to the work machine side.

* * * * *